(12) United States Patent
Serebryanskiy et al.

(10) Patent No.: US 9,748,967 B1
(45) Date of Patent: Aug. 29, 2017

(54) PERIODIC SIGNAL AVERAGING WITH A TIME INTERLEAVING ANALOG TO DIGITAL CONVERTER

(71) Applicant: Guzik Technical Enterprises, Mountain View, CA (US)

(72) Inventors: Valeriy Serebryanskiy, Santa Clara, CA (US); Anatoli B. Stein, Atherton, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/447,728

(22) Filed: Mar. 2, 2017

(51) Int. Cl.
| G06F 17/10 | (2006.01) |
| H03M 1/12 | (2006.01) |
| H03M 1/50 | (2006.01) |
| H03H 17/06 | (2006.01) |
| G06F 17/14 | (2006.01) |

(52) U.S. Cl.
CPC ........ *H03M 1/1215* (2013.01); *G06F 17/141* (2013.01); *H03H 17/06* (2013.01); *H03M 1/124* (2013.01); *H03M 1/50* (2013.01)

(58) Field of Classification Search
None
See application file for complete search history.

(56) References Cited

U.S. PATENT DOCUMENTS

| 6,909,979 | B2 | 6/2005 | Saitou et al. | |
| 7,362,795 | B1 | 4/2008 | Lennen | |
| 7,382,304 | B2 | 6/2008 | Stein | |
| 7,813,297 | B2 | 10/2010 | Hafed | |
| 8,587,464 | B2 * | 11/2013 | Bonaccio | H03M 1/182 341/118 |
| 9,209,825 | B1 * | 12/2015 | Visani | H03M 1/0626 |
| 9,525,428 | B2 * | 12/2016 | Devarajan | |
| 9,654,133 | B2 * | 5/2017 | Speir | H03M 1/128 |
| 2013/0314261 | A1 * | 11/2013 | Gomez | H03M 1/06 341/118 |
| 2015/0204649 | A1 | 7/2015 | McFarthing et al. | |
| 2016/0049949 | A1 * | 2/2016 | Waltari | H03M 1/0626 341/120 |

\* cited by examiner

*Primary Examiner* — David H Malzahn
(74) *Attorney, Agent, or Firm* — Burns & Levinson, LLP; Joseph M. Maraia

(57) ABSTRACT

A method and apparatus for processing a periodic analog signal using a composite ADC including a time interleaved set of sub-ADCs, to produce a replica signal representative of the analog signal, wherein the replica signal is characterized by suppression of additive noise on the periodic analog signal, and correction of sub-ADC-caused distortions. Streams of samples from the respective sub-ADCs are accumulated separately for respective positions in signal periods of the periodic analog signal to provide sub-replicas. Fourier transforms of the replicas are determined for the different sub-ADCs, and those Fourier transforms are averaged to obtain a mean Fourier transform. Frequency responses of the sub-ADCs are corrected by dividing the mean Fourier transform by the respective sub-ADC frequency responses. An averaged replica of the signal period is obtained by determining an inverse Fourier transform of the corrected mean Fourier transform.

9 Claims, 2 Drawing Sheets

PERIODIC SIGNAL AVERAGING WITH A TIME INTERLEAVING ANALOG TO DIGITAL CONVERTER

FIELD OF THE TECHNOLOGY

The technology relates to noise suppression in periodical signals and, more particularly, to signal averaging with the use of high speed time interleaving composite analog to digital converters (ADCs).

BACKGROUND OF THE TECHNOLOGY

There are applications (most often in the test and measurement industry), where a periodic signal passes through a medium with an additive noise, with the noise level exceeding (and sometimes far exceeding) the signal level. In many situations, it is desired to process a noisy periodic signal to eliminate, or substantially suppress, the noise component, to obtain a replica of the original periodic signal. An effective method of noise suppression and production of a replica of the original signal (with reduced noise) is based on an accumulation of samples of a number of signal periods with simultaneous or subsequent averaging.

A block diagram of an exemplary conventional apparatus 10 for periodic signal reproduction is shown in FIG. 1. As shown in that figure, apparatus 10 includes an analog signal input 10A for receiving an analog signal to be processed, a sampling input 10B for receiving a sampling clock signal, and an output terminal 10C for providing a system output signal.

Apparatus 10 further includes (i) an analog to digital converter (ADC) 11 having an analog signal input 11A coupled to input 10A for receiving an applied analog signal to be processed, an ADC sampling clock input 11B coupled to input 10B for receiving an applied ADC sampling clock signal and an ADC output 11C, (ii) an adder 12 having a first input 12A coupled to ADC output 11C, a second input 12B and an adder output 12C, (iii) a memory 14 having a WRITE input 14A coupled to adder output 12C, a READ output 14B coupled to system output 10C and an address input 14C, and (iv) a Modulo N counter 16 having a count input 16A coupled to input 10B for receiving the sampling clock signal and a count output 16B coupled to address input 14C.

In operation, ADC 11 receives a periodic (at frequency $F_S$) analog signal to be processed at its input 11A, and an ADC sampling clock (at frequency $F_C$) at its input 11B. In response to the analog signal and the sampling clock, ADC 11 provides a digital signal in the form of a succession of digitized samples of the analog signal, at ADC output 11C. That succession of samples summed with a succession of previously stored sample values by way of memory output 14C of memory 14 and adder input 12B, is applied via adder 12 to the WRITE input 14A of memory 14.

The frequency of the ADC sampling clock $F_c$ is chosen with respect to frequency $F_S$, in such a way that a period of the periodic analog signal to be processed contains an integer number N samples per period of the analog signal produced by the ADC 11. Thus, the ADC sampling frequency $F_c$ is a harmonic of the signal frequency $F_S$: $F_c = N \cdot F_s$.

The input 16A of the modulo N counter 16 receives the sampling clock from sampling clock input 10B, so that the counter 16 in effect counts the number of samples at the output 11C of ADC 11 (the counting being done by modulo N). The number at the counter output 16B indicates the number of a "current" sample position in the period of the analog signal applied from analog signal input 10A. The output 16B of counter 16 is applied to the address input 14C of memory 14. In response to each successive count value, the current sample value at the adder output 12C is entered in a location, or cell, of memory 14 having an address that corresponds to the position of the sample in the then-current period of the analog signal. As a result, the next sample produced by ADC 11 is added by adder 12 to the number, or value, at the READ output of memory 14, and the resultant sum is written into a corresponding cell of memory 14.

After the applied periodic analog signal has been so-processed for M periods of the analog signal, that memory cell contains a sum of M samples, where M is the number of appearances of the corresponding position during the signal acquisition. Each sample at the ADC output 11C is representative of a sum of a "true" value of an underlying base (without noise) component of the analog signal applied at input 10A, and a value representative of a noise component of the signal applied at input 10A. As a result, a sample at the memory output 14C (and system output 10C) at each time instant, corresponds to a specific period position (in the applied analog signal), and equals the sample true value multiplied by M plus the sum of noise values which have appeared in this position of the period. If the number M is sufficiently large, the noise contribution in the output sample becomes negligibly small as opposed to the contribution the "true" values, and the signal at the memory output 14C for all practical purposes repeats the period of the applied periodic analog signal but without the noise components. This prior art method of periodic signal detection based on accumulation and averaging is in part effective, but is characterized by substantial limitations, particularly when the frequency of processed signal is high, as described below.

The relative efficiency of detection of periodic signals based on accumulation and averaging, caused its widespread application in a great variety of devices and systems (see, for example, U.S. Pat. No. 6,909,979; No. 7,362,795; No. 7,382,304; No. 7,813,297; US Patent Application Publication US2015/0204649; and others). However, the use of accumulation and averaging, when the frequency of processed signal is high, has met with substantial difficulties. Processing signals with high frequency requires use of high speed ADCs, which are typically built as composite units consisting of a number of time interleaved sub-ADCs with a common input and sequential timing. In general, for such time interleaved ADCs, the DC offsets as well as amplitude and phase frequency responses of the different sub-ADCs are not identical, resulting in specific signal distortions, for example, including the appearance of spurious frequency components. Such signal distortions are significantly detrimental to the performance of periodic analog signal averaging using composite ADCs based on time interleaved sub-ADC configurations.

The correction of distortions of composite ADCs caused by DC offsets mismatch of sub-ADCs, may be accomplished using compensation based on average values of DC offsets of the respective sub-ADCs (see U.S. Pat. No. 9,172,388), while the misalignment of frequency response may be rectified by equalization (see U.S. Pat. No. 7,408,495, No. 8,284,606 and others). The direct use of these conventional methods in the case of periodic signals averaging, presents certain difficulties because of the difference in the required accumulation. In particular, to effect correction of mismatched DC offsets and misalignments of the frequency responses, the accumulation should be performed for each sample in an interval that equals the number of sub-ADCs in the composite ADC multiplied by the composite ADC period, while the averaging of the periodic signal requires an accumulation for each sample in an interval that equals the number of ADC sample periods in the processed signal period. Thus, determination of the respective corrections by prior art methods for use with composite ADC-based configurations, is subject to conflicting requirements.

The subject technology provides an improved method and apparatus for periodic signal averaging that provides correction of the distortions typical for the composite ADCs.

SUMMARY OF THE TECHNOLOGY

According to an exemplary form of the present technology, for an analog signal to be processed by a composite ADC including a time interleaved set of K sub-ADCs, a suppression of additive noise on the signal, and correction of ADC-caused distortions, are performed by the following sequence of operations:

for each sub-ADC of the composite ADC, the analog signal to be processed is first converted into stream of digital samples with a sampling clock frequency $F_c$ determined according the equation $F_c/F_s=K \cdot L/(Q+1)$, where $F_s$ is frequency of the analog signal to be processed signal, K is a number representative the particular sub-ADC in the composite ADC, L is a number representative of the position in the signal period of the desired reconstructed replica of analog signal to be processed, and Q is a number of representative of time between two successive samples produced by the particular sub-ADC;

the samples are accumulated separately for the respective sub-ADCs and respective positions in the signal periods, wherein each accumulated set of samples is a sub-replica of the respective signal period;

a Fourier transform is calculated for each accumulated set of samples;

the Fourier transforms for the respective sub-ADCs are averaged, whereby this averaging is carried out separately for amplitude and phase of the Fourier transforms to eliminate time misalignment between different sub-ADCs;

the averaged amplitude and phase of the Fourier transforms of the respective sub-ADCs, are equalized to correct the deviation of ADC frequency responses from the respective target frequency responses; and an inverse Fourier transform of the respective equalized Fourier transforms are calculated to reproduce a desired replica of the analog signal, whereby the replica of the analog signal is characterized by being free from, or having suppressed, additive noise, as well as distortions introduced by the composite ADC.

DETAILED DESCRIPTION

Figure 1:
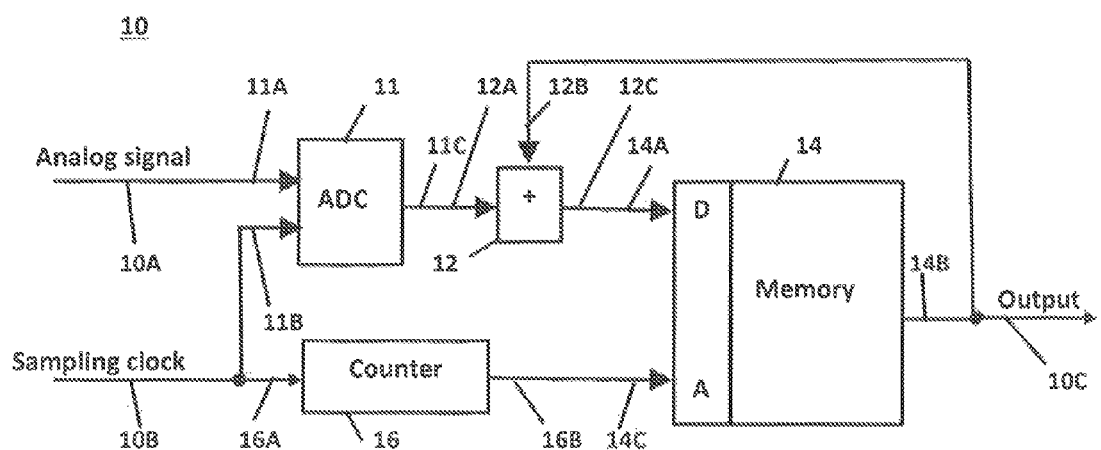
FIG. 1 shows in block diagram form, a prior art apparatus for periodic signal reconstruction.

The present technology is a method and apparatus for averaging a periodic analog signal to be processed, using a composite ADC, to produce a replica signal, or "replica", of the periodic analog signal, which is characterized as being free from, or having suppressed, additive noise, as well as distortions introduced by the composite ADC. In a form, the replica signal is formed as a set R(q), $0 \leq q < L$, of values corresponding to values in a signal period of the periodic analog signal, in the time positions $t_q=T/L \cdot q$, where T is length of the signal period, and L is representative of a number of distinct time positions during the signal period of the replica. The number L of positions in the signal period determines the precision with which the replica R(q) describes the analog signal: the greater the L, the more the description of the analog signal period by replica is precise and detailed.

According to a form of the present technology, accumulation of the samples of the processed signal is carried out separately for each sub-ADC with the number p, $0 \leq p < K$, where K is the number of sub-ADCs in the composite ADC. The accumulation produces sub-replicas $R_p(q)$, each sub-replica being formed by averaging of samples which were produced by the sub-ADC with the number p only.

The values of $R_p(q)$ are determined for each position q, $0 \leq q < L$, in the analog signal period. For this purpose, the samples, which are produced by the sub-ADC with the number p, appear in all positions of the analog signal period. For this reason, the number Q of positions between two adjacent samples, which were produced by the same sub-ADC, is co-prime relative to the number L of positions in a signal period.

The time interval between two adjacent positions in a signal period equals $T/L=1/(F_s \cdot L)$. Therefore the time interval between two adjacent samples, which are produced by the same sub-ADC, has a duration $\Delta t=(Q+1)/(F_s \cdot L)$. On the other hand, the number of samples which are produced by other sub-ADCs in the considered interval, equals K−1. Therefore, the duration $\Delta t$ equals the length of K cycles of the sampling frequency $f_c$: $\Delta t=K/F_c$. A comparison of the two expressions for the interval duration $\Delta t$ leads to the equation:

$$(Q+1)/(F_s \cdot L)=K/F_c \text{ or } F_c/F_s=K \cdot L/(Q+1).$$

On one hand, the application of that equation approximately determines the required frequencies $F_c$, and $F_s$. On the other hand, the required precision of signal period reconstruction determines the number L of positions in the signal period. To ensure the fulfillment of the above equation, the frequency $F_c$ or/and $F_s$, is preferably adjusted in a corresponding manner. In a preferred form, the required relationship between the frequencies is achieved by adjustment of the signal frequency $F_s$. However, in some cases the frequency $F_s$ of the signal source cannot be changed (as in radio astronomy measurements, for example). In such a case the adjustment is made by changing the ADC sampling clock frequency $F_c$.

Figure 2:
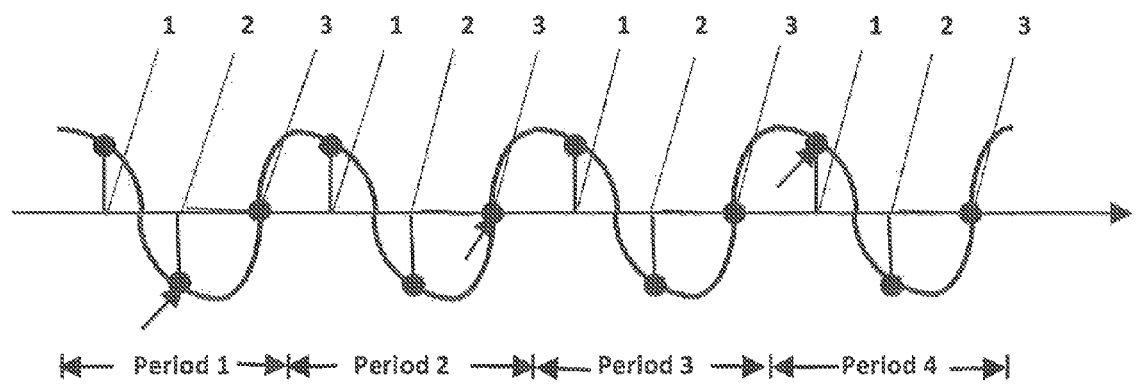
FIG. 2 shows a time diagram illustrating a progression of sample points of a periodic analog signal for use with a sub-ADC in accordance with the technology.

As an example, where the sampling clock frequency $F_c$ equals 40 GHz, the required signal frequency $F_s$ is approximately 13 GHz, the number of sub-ADCs K is 4, and the number of positions in a signal period is chosen to be 3. The calculation according the foregoing equation leads to the value Q=2.901. The nearest integer is Q=3. To achieve such a value of Q, the signal frequency $F_s$ is adjusted to $F_s=F_c/3=13.333$ GHz. A corresponding time diagram is shown in FIG. 2. In that figure, four periods of an exemplary analog signal to be processed are shown and K−1 (=3) ADC samples appear in one period of the signal. For a given phase difference between the ADC clock and the signal, the samples occupy unequivocally determined K−1 positions in a signal period, these positions being the same in all periods. The samples that are produced by a sub-ADC with the number p in the adjacent signal periods are shifted, one in relation to another, by one position: if the sample in the current period is in a position with a number q, then in the next period it will occupy the position q+1. The numbers shown in FIG. 2 are the numbers of positions in a period. The samples, which are produced by the same sub-ADC are marked by small arrows. The first of these samples is located in position 2 of period 1, the next sample is located in position 3 of period 2, and the third sample is located in position 1 of period 4.

According to the illustrated form of the present technology, reconstruction of a periodic signal is performed in two stages: an acquisition stage and a distortions correction stage.

At the acquisition stage, the processing of the input analog signal produces a collection of K sub-replicas $R_p(q)$, that is, one for each sub-ADC with the number p.

The accumulation of the sub-replicas $R_p(q)$ is carried out in the following manner. Before the start of signal processing, all values $R_p(q)$ are reset to zero. During the acquisition, each sample that was created by a sub-ADC number p, and has appeared in the position of signal period with the number q, is added to the value $R_p(q)$, and stored. In that way, the value $R_p(q)$ accumulates the sum of the samples that were produced by sub-ADC number p and appeared in position q of the signal period. At the end of the acquisition stage, the accumulated sum is divided by the number of appearances of a sample produced by sub-ADC number p in the position q of the signal period.

The resulting value $R_p(q)$ equals the "true" value of samples produced by sub-ADC number p in position q, plus the averaged sum of noise values. If the duration of the acquisition stage is sufficiently large, the noise contribution to the sum becomes negligibly small, as compared to the contribution of the true values. As a result, the accumulated values $R_p(q)$ are considered as the values of samples which would be produced by sub-ADC number p in position q in the absence of noise.

The values $R_p(q)$ found at the acquisition stage, are used as initial data for the distortions correction stage to reconstruct the true signal period. The distortions correction operation removes the distortions which are present due to time misalignment between different sub-ADCs, misalignment of their frequency responses, and mismatch of direct current offsets. For this purpose, an averaging of the values $R_p(q)$ over the sub-ADC number p, is carried out. That averaging eliminates distortions caused by distinctions between the different sub-ADCs.

After averaging, an equalization operation is performed to correct the distortions caused by deviation of the frequency responses of the ADC as a whole from a nominal response.

In a preferred embodiment of the present technology, the averaging procedure is performed pursuant to the following operations.

For a fixed number p of a sub-ADC, the sub-replica $R_p(q)$ is considered as a function of the position number q. As a first step of the distortions correction, a Fourier transform $F_p(k)$ of the function $A_p(q)$ is calculated for each p, $1 \leq p \leq K$ according to the equation:

$$F_p(k) = \sum_{q=0}^{L-1} A_p(q) \cdot \exp(j \cdot 2 \cdot \pi \cdot k \cdot q/L).$$

The argument k above is a number of a frequency for which the value of the Fourier transform $F_p(k)$ is calculated.

The Fourier transforms $F_p(k)$ for different p are different because of sub-ADCs frequency responses misalignment in the composite ADC. To eliminate, at least reduce, the impact of the sub-ADCs' frequency responses misalignment upon the signal period reconstruction, a mean Fourier transform MF(k) is calculated.

The Fourier transforms $F_p(k)$ equals the Fourier transform of the true signal multiplied by the frequency response of the sub-ADC number p. The deviation of sub-ADCs' frequency responses from the nominal response, is the cause of distortions of the Fourier transforms $F_p(k)$. These distortions have a multiplicative nature rather than an additive one. For this reason, in a preferred embodiment of this technology, the averaging of the Fourier transforms is done by calculating a geometric mean instead of a "usual" arithmetical mean:

$$MF(k) = \sqrt[k]{\left(\prod_{p=1}^{K} Fp(k)\right)}$$

In most cases, in addition to sub-ADC misalignment, the frequency response H(k) of the ADC as a whole is distorted too. For a corresponding correction, the ADC frequency response H(k) is measured preliminarily during the apparatus calibration. Then, the corrected average Fourier transforms CAF(k) is calculated by dividing the average Fourier transform MF(k) by the frequency response H(k) for each k.

As a last step, a reconstructed replica of the true signal period R(q) is calculated as the inverse Fourier transform of the CAF(k).

Figure 3:
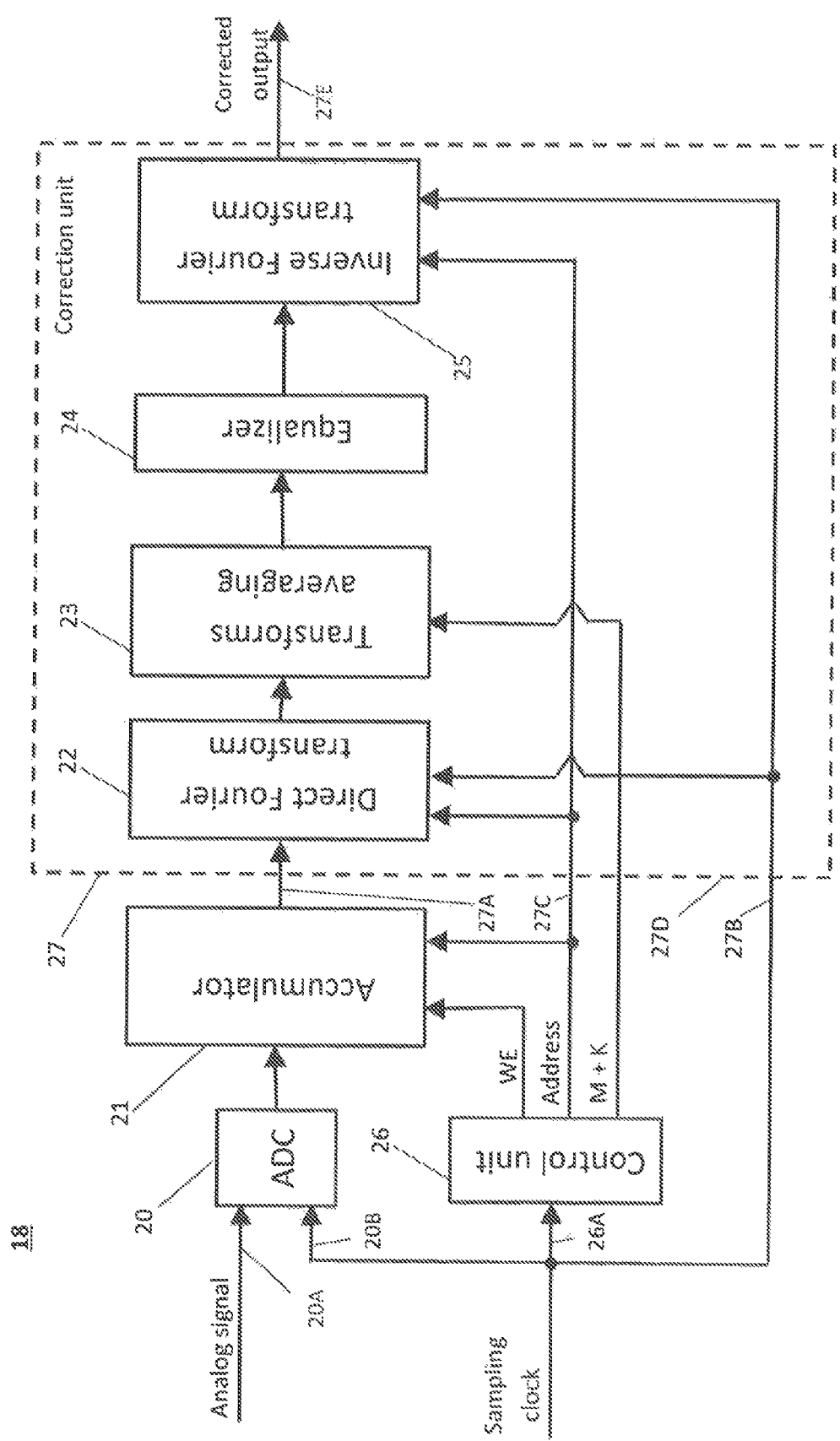
FIG. 3 shows in block diagram form, an exemplary embodiment of the present technology.

A block diagram of an exemplary apparatus 18 that implements the method outlined above is shown in FIG. 3. As described in detail below, apparatus 18 includes an ACD 20, an accumulator 21, a control unit 26 and a correction unit 27.

As shown in FIG. 3, ADC 20 receives at its inputs 10A and 10B, an incoming periodic analog signal to be processed and a sampling clock, respectively. To enable processing of high frequency analog signals, ADC 20 is a composite ADC consisting of K time interleaved sub-ADCs. ADC 20 is responsive to the applied sampling clock at clock frequency $F_c$, to convert an applied periodic analog signal into a stream of digital samples.

A control unit 26 produces service signals that are necessary for operation of the other units of the apparatus 18, namely, a binary "Write enable" signal (WE), an "M+K" signal, and an "Address" signal. The binary WE signal equals 1 during a first M signal periods, indicating performance of the accumulation stage of the signal processing, and equals 0 the remaining time, indicating performance of the correction stage of the signal processing. The "M+K" signal denotes by a positive transition the end of the time interval that contains M+K signal periods, a mark that is used in the operation of a geometric mean calculator 23. The "Address" signal is a stream of numbers (p, q), where p is the number of the sub-ADC which produced a then-current sample, and q is a number representative of a then-current position of that sample in the signal period. The numbers p and q are concatenated, forming a combined address. A "position"-related part q of the address changes with the frequency $F_c$ of the sampling clock, repeating itself each L sampling clock cycles, where L is the number representative of the position in a signal period. During the accumulation stage of the signal processing, a "sub-ADC number p"-related part changes with the same frequency $F_c$, but repeats itself every K sampling clock cycles. During the correction stage, the sub-ADC number p part of the address is incremented by 1 with each D sampling clock cycle, where D is the duration of the operation step of correction unit 27.

The accumulator 21 has a signal input, which receives samples from the output of ADC 20, a WE input and an Address input. Accumulator 21 incorporates an internal memory with K·L memory cells. During the accumulation stage of the signal processing, when the write enable signal WE equals 1, accumulator 21 at each sampling clock cycle renews the contents of the memory cell associated with an address (p, q) present at this time at the Address input. The incoming ADC sample is added to the previously accumulated value which has been saved in the memory call, and the sum is written to the cell anew. During the correction stage of the signal processing, the contents of the memory cells remain unchanged. At that time, the output of accumulator 21 produces a ratio at each sampling clock cycle, wherein that ratio is calculated as the value accumulated in the cell with the current address (p, q), divided by the number of appearances of the address (p, q) during the accumulation stage of M signal periods.

During the corrections stage, the correction unit 27 processes the values, applied to its input from the output of the accumulator 21, and corrects the distortions which have been introduced in the composite ADC 20.

The values applied to the input 27A of the correction unit 27 are received by the Fourier transform unit 22. The Fourier transform unit 22 is implemented as an FIR filter with variable coefficients. The FIR filter determines the Direct Fourier transform of each set of L values applied to its input, and produces at its output, the resulting values of a Direct Fourier transform, one by one, with each cycle of the sampling clock.

During the time interval that follows the accumulation stage, transforms averaging unit 23 aggregates the received Fourier transforms, calculating in that way a mean transform MF(k). In a preferred embodiment of the present technology, the transforms averaging unit 23 is implemented as a geometric mean calculator. At each step of calculation, the values which have been accumulated in the geometric mean calculator, are multiplied by corresponding values of the Fourier transform which are applied from the Fourier transform unit 22. When a positive transition appears in the M+K signal, a radical of power K of the accumulated product, is determined and is produced at the output 27E of correction unit 27.

The mean value MF(k) of the K Fourier transforms which describe the different sub-ADCs, is transferred from the transforms averaging unit 23 to the equalizer 24. In equalizer 24, the terms of the mean value are divided by the terms of the frequency response H(k) of the ADC 20 as a whole. This operation eliminates distortions which have been caused by deviation of the ADC 20 frequency responses from the nominal ones.

The equalized average of the K Fourier transforms is applied from the equalizer 24 to an input of the Inverse Fourier transform unit 25. The Inverse Fourier transform unit 25 is implemented as a FIR filter with variable coefficients also. In that FIR filter, a calculation of the inverse Fourier transform of the equalized geometric mean produces the reconstructed replica R(q) of the true signal period.

Although the foregoing description of the embodiment of the present technology contains some details for purposes of clarity of understanding, the technology is not limited to the detail provided. There are many alternative ways of implementing the technology. The disclosed embodiment is illustrative and not restrictive.

What is claimed is:

1. A method for averaging an analog periodic signal characterized by a signal frequency $F_s$, and an associated period, comprising the steps of:
   by a composite ADC including K time interleaved sub-ADCs characterized by a sampling clock frequency $F_c$, wherein each sub-ADC is characterized by a frequency response H(k) where k is an integer in a range between and including 1 and K,
   A. converting the periodic analog signal by each of the K sub-ADCs, to an associated stream of digital samples, wherein at least one of the signal frequency $F_s$ and the sampling clock frequency $F_c$ are selected whereby the stream of samples from each sub-ADC are provided in an associated time position in the periods of the analog signal, and
   by a signal processing network:
   B. averaging the respective streams of digital samples for each sub-ADC number p and each position q in the signal period, producing a set of sub-replicas $R_p(q)$;
   C. accumulating the respective averaged streams of digital samples,
   D. calculating Fourier transforms F(p, k) of the set $R_p(q)$ for different sub-ADC numbers p;
   E. averaging the Fourier transforms F(p, k) over the sub-ADC number p for each frequency number k separately and producing a mean Fourier transform MF(k);
   F. correcting mean Fourier transform by correcting the ADC frequency response for the respective sub-ADCs as a total by dividing the mean Fourier transform MF(k) by the ADC frequency response H(k) of the respective sub-ADDs; and
   G. calculating the averaged replica R(q) of the analog signal by determining an inverse Fourier transform of the corrected mean Fourier transform.

2. A method for averaging an analog periodic signal according to claim 1, comprising the further step of, prior to step F, determining the frequency response H(k) for the k sub-ADCs.

3. A method for averaging an analog periodic signal according to claim 1, wherein the averaging of the Fourier transforms F(p, k) is carried out by calculating the geometric mean MF(k) of the set F(p, k).

4. A method for averaging an analog periodic signal according to claim 1, wherein the averaging is performed in the time domain.

5. A method for averaging an analog periodic signal according to claim 1, wherein the signal frequency $F_s$ only is selected whereby the stream of samples from each sub-ADC are provided in an associated time position in the periods of the analog signal.

6. A method for averaging an analog periodic signal according to claim 1, wherein the sampling clock frequency $F_c$ only is selected whereby the stream of samples from each sub-ADC are provided in an associated time position in the periods of the analog signal.

7. An apparatus for averaging an analog periodic signal characterized by a signal frequency $F_s$, and an associated period, comprising:
   A. a composite ADC including K time interleaved sub-ADCs characterized by a sampling clock frequency $F_c$, wherein each sub-ADC is characterized by a frequency response H(k) where k is an integer in a range between and including 1 and K, and wherein the composite ADC includes (i) an analog signal input for coupling a received periodic analog signal to be processed to a signal input of the respective sub-ADCs, (ii) a sampling clock input for coupling a received clock signal characterized by a clock frequency $F_c$ to a sampling clock input of the respective sub-ADCs, and (iii) an composite ADC output, and wherein each of the K sub-ADC is responsive to the periodic analog signal applied to its signal input and the clock signal applied to its sampling clock input, to convert the analog signal to an associated stream of digital samples, wherein at least one of the signal frequency $F_s$ and the sampling clock frequency $F_c$ are selected whereby the stream of samples from each sub-ADCs are provided to the ADC output in respective ones of associated time position in the periods of the analog signal, B. a control unit having control clock input connected to the sampling clock input of the ADC, for coupling the received clock signal to the control clock input, and three outputs:
  i. a WE output that provides a binary value 1 during a first M signal periods of the processing of the applied analog periodic signal, and a binary value 0 during a remaining part of the processing of the applied analog periodic signal;
  ii. An Address output that provides for each sub-ADC, an address containing a sub-ADC number part p and a period position part q, wherein: (a) during the first M signal periods of the signal processing, the sub-ADC number parts p change with the sampling clock frequency and repeats itself each K sampling clock cycles, (b) during the remaining part of the signal processing, the sub-ADC number parts p are incremented by one at each step of an ADC distortions correction operation, and (c) the period position parts q is change with the sampling clock frequency and are repeating for each of L sampling clock cycles, where L is a number of position in the signal period; and
  iii. an M+K output which provides a positive transition which is delayed by M+K signal periods relative to the start of the signal processing;

C. an accumulator having a signal input connected to the output of the composite ADC, a WE input connected to the WE output of the control unit, and an address input connected to the Address output of the control unit, and an accumulator output, wherein said accumulator is configured to accumulate the ADC samples for each address (p, q) separately and to provide at the accumulator output, an accumulated value divided by the number of appearances of the address (p, q); and D. a correction unit with a correction signal input connected to the accumulator output, a sampling clock input, connected to the ADC sampling clock input, an address input, connected to the address output of the control unit, a M+K input connected to the M+K output of the control unit, and a corrected output, wherein said correction unit is configured to correct distortions incurred in the composite ADC.

8. An apparatus for averaging an analog periodic signal according to claim 7, wherein the correction unit comprises:
  A. a direct transform FIR filter having an FIR signal input coupled to the accumulator output, a sampling clock input coupled to the sampling clock input of the correction unit, an address input coupled to the address input of the correction unit, and an FIR output, said direct transform FIR filter being configured to unite accumulator output values corresponding to the same sub-ADC with a number p, into a group, and to calculate a convolution of the group with a set of complex numbers $\exp(-j \cdot 2 \cdot \pi \cdot k \cdot r/(K-1))$, where k is a frequency number;
  B. an averaging unit, having a transforms input connected to the output of the direct transform FIR filter, a M+K input, connected to the M+K output of the control unit, and an averaging output, said averaging unit being configured to accumulate an average of transforms applied from the output of the direct transform FIR filter;
  C. an equalizer, having an input connected to the output of the averaging unit, and an equalizer output, said equalizer being configured to divide values received from the output of the averaging unit by the values of the frequency response H(k) of the ADC as a whole; and
  D. an inverse transform FIR filter having an inverse transform signal input connected to the output of the equalizer, an inverse transform sampling clock input connected to the a sampling clock input of the composite ADC, an address input connected to the address output of the control unit and an inverse transform output coupled to the corrected output, wherein said inverse transform FIR filter is configured to calculate a convolution of the equalized average transform with the set of complex numbers $\exp(j \cdot 2 \cdot \pi \cdot k \cdot r/(K-1))$ and to provide the result at the corrected output as the averaged replica R(q) of the signal period.

9. An apparatus for averaging an analog periodic signal according to claim 8, wherein the averaging unit is a geometric mean calculator, said geometric mean calculator being configured to (i) accumulate a product of transforms applied from the direct transform FIR filter, and (ii) calculate a radical of power K of that product after appearance of a positive transition at the M+K input.

* * * * *